United States Patent

Koyama

(10) Patent No.: US 9,491,387 B2
(45) Date of Patent: Nov. 8, 2016

(54) IMAGE CAPTURING DEVICE HAVING SUBSTRATES CONNECTED THROUGH A CONNECTION UNIT

(71) Applicant: OLYMPUS CORPORATION, Tokyo (JP)

(72) Inventor: Yusaku Koyama, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 14/740,575

(22) Filed: Jun. 16, 2015

(65) Prior Publication Data

US 2015/0281624 A1     Oct. 1, 2015

Related U.S. Application Data

(63) Continuation of application No. PCT/JP2014/051800, filed on Jan. 28, 2014.

(30) Foreign Application Priority Data

Feb. 8, 2013 (JP) ................................. 2013-023785

(51) Int. Cl.
   *H04N 3/14* (2006.01)
   *H04N 5/3745* (2011.01)
   (Continued)

(52) U.S. Cl.
   CPC .... *H04N 5/37455* (2013.01); *H01L 27/14603* (2013.01); *H04N 3/1575* (2013.01); *H04N 5/378* (2013.01); *H04N 5/3742* (2013.01); *H04N 5/37457* (2013.01); *H04N 5/3653* (2013.01)

(58) Field of Classification Search
   CPC .... H04N 5/369; H04N 5/374; H04N 5/3742; H04N 5/3745; H04N 5/376; H04N 5/378; H04N 3/1506; H04N 3/1575

USPC ................................. 348/294, 302, 308-310
   See application file for complete search history.

(56) References Cited

U.S. PATENT DOCUMENTS

| 9,059,056 B2 * | 6/2015 | Kondo | .............. H01L 27/14609 |
| 9,338,384 B2 * | 5/2016 | Kusano | .................. H04N 5/378 |
| 2008/0117321 A1 | 5/2008 | Muramatsu | |

(Continued)

FOREIGN PATENT DOCUMENTS

| JP | 2007-507980 A | 3/2007 |
| JP | 2007-243265 A | 9/2007 |

(Continued)

OTHER PUBLICATIONS

International Search Report dated May 13, 2014 issued in corresponding application No. PCT/JP2014/051800 (1 page).

*Primary Examiner* — Ngoc-Yen Vu
(74) *Attorney, Agent, or Firm* — Westerman, Hattori, Daniels & Adrian, LLP

(57) ABSTRACT

An image-capturing device includes a solid-state image-capturing device in which a first substrate and a second substrate are electrically connected through connection units. The image-capturing device includes: a pixel unit in which a plurality of pixels, each of which has a photoelectric conversion element for generating a photoelectric conversion signal according to an intensity of incident light disposed on the first substrate, are disposed in a two-dimensional matrix and configured to output a photoelectric conversion signal generated by each of the pixels as a pixel signal for every row; a plurality of signal processing units, each of which is disposed for every one or more columns of the plurality of pixels provided in the pixel unit, performs predetermined signal processing on the pixel signal output from the pixel of a corresponding column, and outputs a processed signal including a plurality of signals after the signal processing is performed.

8 Claims, 5 Drawing Sheets

(51) Int. Cl.
*H04N 5/374* (2011.01)
*H04N 5/378* (2011.01)
*H01L 27/146* (2006.01)
*H04N 5/335* (2011.01)
*H04N 5/365* (2011.01)

(56) References Cited

U.S. PATENT DOCUMENTS

2013/0033632 A1* 2/2013 Kishi ............... H01L 27/14634
348/308

2014/0022427 A1* 1/2014 Goto ................... H04N 5/2355
348/296
2015/0021460 A1* 1/2015 Matsuda ............... H04N 9/045
250/208.1

FOREIGN PATENT DOCUMENTS

| JP | 2009-130828 A | 6/2009 |
| JP | 4831146 B2 | 12/2011 |
| WO | 2005/034188 A2 | 4/2005 |

* cited by examiner

IMAGE CAPTURING DEVICE HAVING SUBSTRATES CONNECTED THROUGH A CONNECTION UNIT

CROSS REFERENCE TO RELATED APPLICATIONS

This application is a continuation application based on a PCT Patent Application No. PCT/JP2014/051800, filed Jan. 28, 2014, whose priority is claimed on Japanese Patent Application No. 2013-023785, filed Feb. 8, 2013, the entire content of which are hereby incorporated by reference.

BACKGROUND OF THE INVENTION

1. Field of the Invention

The present invention relates to an image-capturing device.

2. Description of the Related Art

In recent years, as solid-state image-capturing devices, complementary metal oxide semiconductor (CMOS) image sensors have attracted attention and have been put to practical use. While charge coupled device (CCD) image sensors are manufactured using a dedicated manufacturing process, the CMOS image sensors can be manufactured using a general semiconductor manufacturing process. Because of this, the CMOS image sensor can implement multiple functions using various functional circuits embedded therein, for example, as in a system on chip (SOC).

As the image sensor in which the functional circuits are embedded, technology related to a column analog-to digital (AD) conversion type image sensor provided with an AD conversion circuit serving as the functional circuit for every column of the pixel array disposed in a matrix and configured to sequentially output AD-converted digital signals of each row for every column, for example, as shown in Japanese Patent No. 4831146 (hereinafter referred to as Patent Literature 1), is disclosed.

FIG. 5 is a block diagram illustrating a schematic configuration of a conventional solid-state image-capturing device. In FIG. 5, a configuration of the column AD conversion type image sensor disclosed in Patent Literature 1 is simplified and illustrated. The conventional solid-state image-capturing device 900 illustrated in FIG. 5 includes a pixel array unit 10, a vertical scanning circuit 20, a plurality of pixel signal read lines 2, a plurality of AD conversion processing circuits 3, a horizontal scanning circuit 30, a plurality of signal output lines 6, and a plurality of signal output circuits 7.

The pixel array unit 10 is a pixel array in which a plurality of unit pixels 11 are disposed in a matrix. Each of the unit pixels 11 includes a photodiode, and generates a pixel signal (analog signal) corresponding to an intensity of incident light within a given accumulation time.

The vertical scanning circuit 20 performs read control of each unit pixel 11 for every row of the pixel array unit 10 and causes the pixel signal generated by each unit pixel 11 to be output to each pixel signal read line 2 disposed in correspondence with each column of the pixel array unit 10 and commonly connected to all unit pixels 11 of the same column.

Each of the AD conversion processing circuits 3 is connected to one corresponding pixel signal read line 2, that is, disposed in correspondence with one column of the pixel array unit 10. Each AD conversion processing circuit 3 includes an AD conversion unit 4 configured to convert (AD-convert) an input analog signal into a digital signal and a plurality of memory units 5 configured to hold the digital signal obtained by the AD conversion unit 4 performing the AD conversion for every corresponding bit. The AD conversion unit 4 AD-converts a pixel signal input through the corresponding pixel signal read line 2 and outputs a signal (hereinafter referred to as a "bit signal") of each bit of a digital signal of an AD conversion result to the memory unit 5 corresponding to each bit. Each of the memory units 5 holds the corresponding bit signal output from the AD conversion unit 4.

The horizontal scanning circuit 30 sequentially performs output control of each memory unit 5 provided within the AD conversion processing circuit 3 for every column of the pixel array unit 10, that is, sequentially performs output control for each AD conversion processing circuit 3, and causes the bit signal held by each memory unit 5 provided in the AD conversion processing circuit 3 for performing the output control to be output to each signal output line 6 commonly connected to the same bit of the digital signal.

Each of the signal output circuits 7 is connected to the signal output line 6 of the corresponding bit, and externally outputs the bit signal in which any one corresponding bit is output from one memory unit 5, that is, the bit signal in which any one bit is output from one AD conversion processing circuit 3 to the signal output line 6, as each bit signal of a digital output signal output by the solid-state image-capturing device 900.

Through this configuration, the solid-state image-capturing device 900 sequentially outputs digital signals obtained by the AD conversion processing circuits 3 AD-converting pixel signals output from the unit pixels 11 within the pixel array unit 10 as digital output signals. In the solid-state image-capturing device 900, each component is formed on a single semiconductor substrate.

As illustrated in FIG. 5, in the conventional column AD conversion type image sensor, the AD conversion processing circuit 3 is provided for every column of the pixel array unit 10. Thus, a width (a length in the horizontal direction of each AD conversion processing circuit 3 in FIG. 5) of a region available to form the AD conversion processing circuit 3 disposed in each column within the column AD conversion type image sensor is required to be within an interval (pixel pitch) of the unit pixels 11 provided in the pixel array unit 10, that is, to be within a width (a length of the horizontal direction of one pixel in FIG. 5) of one column when the unit pixel 11 is formed.

Because of this, in the conventional column AD conversion type image sensor, the signal output circuit 7 for outputting a digital output signal of each bit is disposed at a position outside the AD conversion processing circuit 3 disposed on a farthest end (a position of the right of the rightmost AD conversion processing circuit 3 in FIG. 5) as illustrated in FIG. 5.

SUMMARY

According to a first aspect of the present invention, there is provided an image-capturing device including a solid-state image-capturing device in which a first substrate and a second substrate are electrically connected through connection units, the image-capturing device including: a pixel unit in which a plurality of pixels, each of which has a photoelectric conversion element for generating a photoelectric conversion signal according to an intensity of incident light disposed on the first substrate, are disposed in a two-dimensional matrix and configured to output a photoelectric conversion signal generated by each of the pixels as a pixel signal for every row; a plurality of signal processing units, each of which is disposed for every one or more columns of the plurality of pixels provided in the pixel unit, performs predetermined signal processing on the pixel signal output from the pixel of a corresponding column, and outputs a processed signal including a plurality of signals after the signal processing is performed; a plurality of signal output lines configured to transfer each signal of the processed signal output by the signal processing unit corresponding to the pixel of the column from which an output operation is performed within a plurality of processed signals output by the plurality of signal processing units; and a plurality of signal output units configured to perform the output operation after compensating for the strength of each signal of the processed signal transferred through each of the plurality of signal output lines, wherein at least each of components for outputting each signal of the processed signal provided in each of the signal processing units to the corresponding signal output line and each of the signal output lines are disposed on either of the first substrate and the second substrate, wherein the signal output unit is disposed on either of the first substrate and the second substrate in which each of the components provided in the signal processing unit and each of the signal output lines are not disposed, wherein the signal output line and the signal output unit are connected through one corresponding connection unit, and wherein each of the connection units is disposed at a position at which a distance from the signal processing unit corresponding to the column of the pixel disposed on a farthest end in the pixel unit to the connection unit is shorter than a distance between two signal processing units corresponding to the columns of the pixels disposed on two ends of the pixel unit.

According to a second aspect of the present invention, in the image-capturing device according to the first aspect, the plurality of pixels disposed in the pixel unit may be divided into a plurality of groups for every predetermined number of columns of the pixel unit, the plurality of signal processing units may be divided into a plurality of signal processing unit groups corresponding to the groups of the pixel unit, the plurality of signal output lines may correspond to the signal processing unit groups and transfer each signal of the processed signal output by the signal processing unit corresponding to the pixel of the column from which the output operation is performed within the plurality of processed signals output by the plurality of signal processing units included in the signal processing unit group for every corresponding signal processing unit group, the plurality of signal output units may be divided into a plurality of signal output unit groups corresponding to the plurality of signal processing unit groups, the connection unit may correspond to each of the plurality of signal output lines, at least each of the components provided in each of the signal processing units included in the signal processing unit group to the corresponding signal output line and each of the signal output lines corresponding to each of the signal processing unit groups may be disposed on either of the first substrate and the second substrate, each of the signal output units included in the signal output unit group may be disposed on either of the first substrate and the second substrate in which each of the components and each of the signal output lines are not disposed, the signal output line of each signal processing unit group and the signal output unit included in the signal output unit group corresponding to the signal output line may be connected through one corresponding connection unit, and each of the connection units may be disposed at a position at which a distance from the signal processing unit corresponding to the column of the pixel disposed at the farthest end in the pixel unit within the group of the pixel unit corresponding to the signal processing unit group to the connection unit is shorter than a distance between two signal processing units corresponding to the columns of the pixels corresponding to two ends of the pixel unit within the group of the pixel unit for every signal processing unit group.

According to a third aspect of the present invention, in the image-capturing device according to the first or second aspect, the signal processing unit may be an AD conversion processing circuit configured to output an n (n is a natural number greater than or equal to 1)-bit digital signal obtained by AD-converting the pixel signal as the processed signal, the plurality of signal output units may be n buffer amplifier circuits corresponding to bit signals of the digital signal, and the plurality of signal output lines may be n signal output lines corresponding to the bit signals of the digital signal.

According to a fourth aspect of the present invention, in the image-capturing device according to any one of the first to third aspects, each of the connection units may be disposed at an intermediate position between two signal processing units corresponding to columns of pixels having a largest distance within the pixel unit corresponding to each signal processing unit for outputting the processed signal to a corresponding signal output line.

DETAILED DESCRIPTION OF THE PREFERRED EMBODIMENTS

First Embodiment

Hereinafter, the first embodiment of an image-capturing device of the present invention will be described with reference to the drawings. The following description includes specific detailed contents as an example. However, those skilled in the art will understand that the detailed contents may be varied or modified and the variations and modifications of the contents are within the scope of the present invention. Accordingly, various exemplary embodiments of the present invention to be described hereinafter will be described without loss of generality of the present invention described in the claims and without limitation on the present invention.

Figure 1:
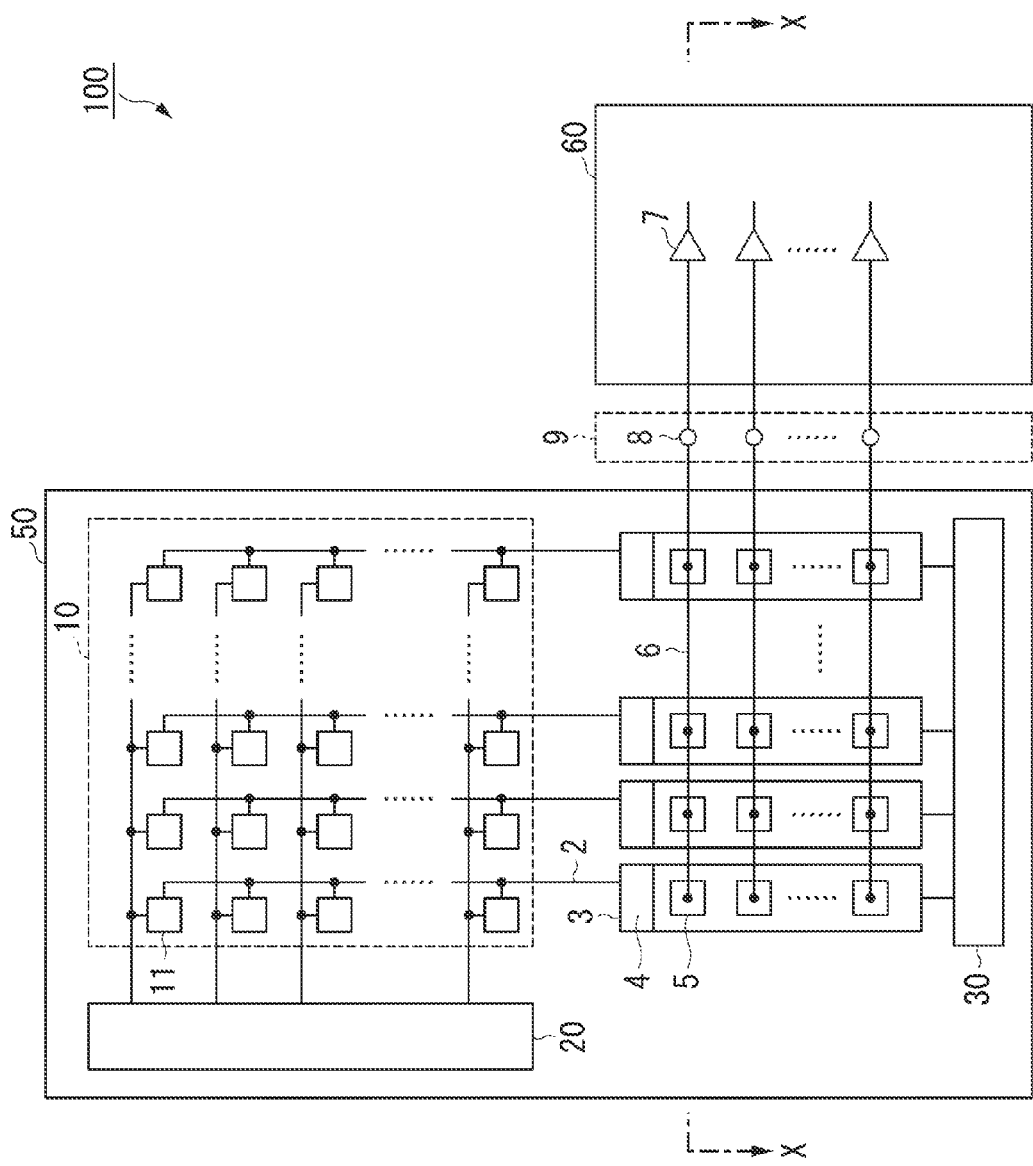
FIG. 1 is a block diagram illustrating a schematic configuration of a solid-state image-capturing device in a first embodiment of the present invention.

FIG. 1 is a block diagram illustrating a schematic configuration of a solid-state image-capturing device in this first embodiment. The solid-state image-capturing device 100 of this first embodiment illustrated in FIG. 1 includes a first substrate 50, a second substrate 60, and an inter-substrate connection unit 9. Then, the solid-state image-capturing device 100 includes a pixel array unit 10, a vertical scanning circuit 20, a plurality of pixel signal read lines 2, a plurality of AD conversion processing circuits 3, a horizontal scanning circuit 30, and a plurality of signal output lines 6 within the first substrate 50 and includes a plurality of signal output circuits 7 within the second substrate 60. The first substrate 50 and the second substrate 60 are separately manufactured, electrically connected through the inter-substrate connection unit 9 and form the solid-state image-capturing device 100 in a state in which the first substrate 50 and the second substrate 60 are bonded.

The solid-state image-capturing device 100 is a column AD conversion type image sensor provided as a functional circuit of the solid-state image-capturing device 100 and configured to sequentially output digital signals into which the AD conversion processing circuits 3 has AD-converted pixel signals (analog signals) output from unit pixels 11 within the pixel array unit 10 as digital output signals.

The pixel array unit 10 is a pixel array in which a plurality of unit pixels 11 are disposed in a two-dimensional matrix of a row direction (a horizontal direction in FIG. 1) and a column direction (a vertical direction in FIG. 1) of the solid-state image-capturing device 100. Each of the unit pixels 11 includes a photodiode (photoelectric conversion element), and generates a photoelectric conversion signal (analog signal) according to an intensity of incident light within a given accumulation time. In addition, each of the unit pixels 11 outputs the generated photoelectric conversion signal as a pixel signal (analog signal) to the pixel signal read line 2 according to read control from the vertical scanning circuit 20.

Each of the pixel signal read lines 2 is a signal line disposed in correspondence with one column of the pixel array unit 10 and commonly connected to all unit pixels 11 of the same column. Each pixel signal read line 2 transfers a pixel signal (analog signal) output from the unit pixel 11 of a corresponding column read by read control of the vertical scanning circuit 20 to the corresponding AD conversion processing circuit 3.

The vertical scanning circuit 20 performs the read control of the pixel signal for each unit pixel 11 within the pixel array unit 10 for every row of the unit pixels 11 disposed in the pixel array unit 10. The vertical scanning circuit 20 causes the pixel signal (analog signal) generated by each unit pixel 11 of the row from which the pixel signal is read to be output to the pixel signal read line 2 of each column through read control of the pixel signal for the unit pixel 11.

Each of the AD conversion processing circuits 3 is a signal processing circuit connected to each of the corresponding pixel signal read lines 2, that is, disposed in correspondence with each column of the pixel array unit 10. Each AD conversion processing circuit 3 includes an AD conversion unit 4 configured to convert (AD-convert) an input analog signal into a digital signal and a plurality of memory units 5, each of which is a signal output unit configured to hold the digital signal obtained by performing the AD conversion in the AD conversion unit 4 for every corresponding bit. The AD conversion unit 4 AD-converts a pixel signal input through the corresponding pixel signal read line 2 and outputs a signal (hereinafter referred to as a "bit signal") of each bit of a digital signal of an AD conversion result to the memory unit 5 corresponding to each bit. Each of the memory units 5 holds the corresponding bit signal of the digital signal output from the AD conversion unit 4. In addition, each of the memory units 5 outputs the held bit signal as a signal of each bit of the digital signal to the signal output line 6 according to output control from the horizontal scanning circuit 30.

Each of the signal output lines 6 is a signal line disposed in correspondence with a bit of the digital signal and commonly connected to the memory units 5 corresponding to the same bit of the digital signals in all AD conversion processing circuits 3 disposed in columns. Through each signal output line 6, a bit signal output from the memory unit 5 of the corresponding bit output through the output control of the horizontal scanning circuit 30 is transferred to the corresponding signal output circuit 7 within the second substrate 60 via the inter-substrate connection unit 9.

The horizontal scanning circuit 30 sequentially performs output control of bit signals for the memory units 5 provided within the AD conversion processing circuit 3 for every column of the unit pixels 11 disposed in the pixel array unit 10. The horizontal scanning circuit 30 causes the bit signal held in each memory unit 5 of a column from which a digital signal is output to be output to the signal output line 6 of each bit through the output control of the bit signal for the memory unit 5.

The inter-substrate connection unit 9 is a connection unit for electrically connecting the first substrate 50 and the second substrate 60. The inter-substrate connection unit 9 includes a plurality of signal line connection units 8 for electrically connecting a signal line within the first substrate 50 and a signal line within the second substrate 60. In the inter-substrate connection unit 9, as the signal line connection unit 8, for example, a bump or the like manufactured by a vapor deposition method and a plating method is used. Also, the inter-substrate connection unit 9 may be configured to connect an electrode formed on the first substrate 50 and an electrode formed on the second substrate 60. In addition, a space between the first substrate 50 and the second substrate 60 may be filled with an insulating member such as an adhesive. The first substrate 50 and the second substrate 60 transmit and receive a signal via the signal line connection unit 8 corresponding to each signal line provided in the inter-substrate connection unit 9. In the solid-state image-capturing device 100, the signal output line 6 for connecting each memory unit 5 within each AD conversion processing circuit 3 provided in the first substrate 50 and the signal output circuit 7 provided in the second substrate 60 are connected through the corresponding signal line connection unit 8.

Each of the signal output circuits 7 is a buffer amplifier circuit configured to externally output a bit signal output from the memory unit 5 of any one of corresponding bits provided in the AD conversion processing circuit 3 to the signal output line 6 by compensating for the strength of each bit signal of the digital output signal output by the solid-state image-capturing device 100. The signal output line 6 through which the corresponding bit signal is output from any one AD conversion processing circuit 3 within the first substrate 50 is connected to each of the signal output circuits 7 via the inter-substrate connection unit 9.

Through this configuration, the solid-state image-capturing device 100 sequentially transfers digital signals corresponding to pixel signals AD-converted within the first substrate 50 to the second substrate 60 for every column to the second substrate 60 and sequentially outputs the digital signals as digital output signals from the second substrate 60 to the outside of the solid-state image-capturing device 100.

Figure 2:
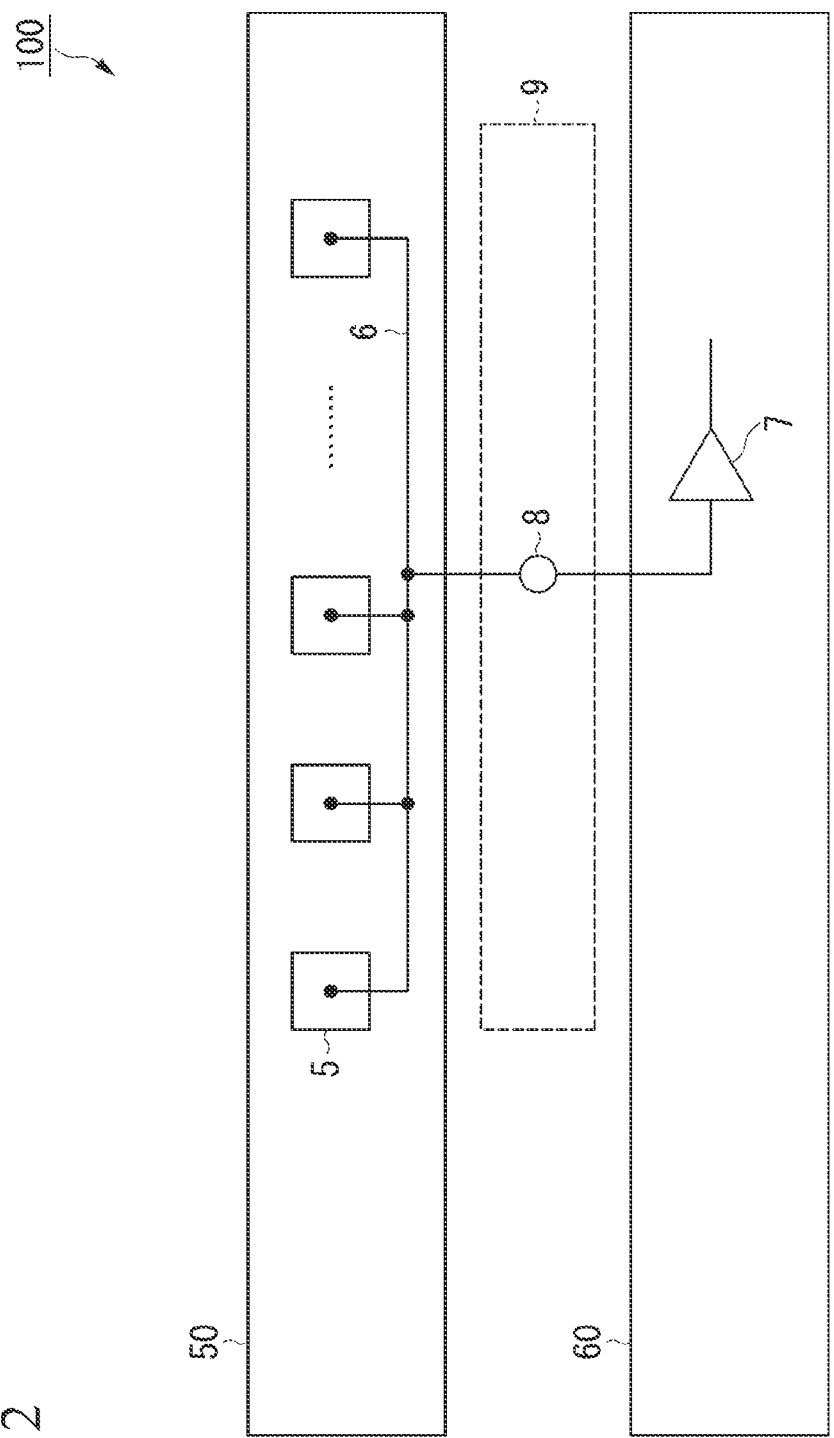
FIG. 2 is a block diagram illustrating a schematic configuration of substrates in the solid-state image-capturing device of this first embodiment.

Next, a configuration of the solid-state image-capturing device 100 of this first embodiment will be described. FIG. 2 is a block diagram illustrating a schematic configuration of substrates in the solid-state image-capturing device 100 of this first embodiment. FIG. 2 illustrates components formed on each substrate in a portion (X-X section) indicated by a dashed line X-X in a block diagram of the solid-state image-capturing device 100 illustrated in FIG. 1.

At a position of the X-X section in the solid-state image-capturing device 100, the memory units 5 corresponding to the same bit of the digital signals provided within the AD conversion processing circuits 3 of the columns and the signal output line 6 commonly connected to each memory units 5 through which the bit signals held by the memory units 5 are output are formed in the first substrate 50. In addition, the signal output circuit 7 configured to output the bit signal output to the signal output line 6 as the digital output signal to the outside of the solid-state image-capturing device 100 is formed in the second substrate 60.

Then, in the solid-state image-capturing device 100, the signal output line 6 formed in the first substrate 50 and the signal output circuit 7 formed in the second substrate 60 are connected at one position of the signal output line 6 through the signal line connection unit 8 within the inter-substrate connection unit 9. In FIG. 2, the case in which the signal output line 6 formed in the first substrate 50 and the signal output circuit 7 formed in the second substrate 60 are connected via the signal line connection unit 8 disposed at an intermediate point of the signal output line 6 is illustrated. That is, at an intermediate position of a region in which all AD conversion processing circuits 3 are formed, the signal output line 6 formed in the first substrate 50 is connected to the signal output circuit 7 formed in the second substrate 60.

In this manner, by connecting the signal output line 6 formed in the first substrate 50 and the signal output circuit 7 formed in the second substrate 60 at the intermediate point of the signal output line 6, it is possible to shorten a wire length of the signal output line 6 from the memory unit 5 disposed on a farthest end, that is, disposed at a farthest position (a position at a distance) from the intermediate point, to the signal output circuit 7. Thereby, it is possible to reduce a load to be driven when the bit signal is output even in the memory unit 5 disposed on the farthest end, that is, even in the memory unit 5 from which the wire length of the signal output line 6 is longest and in which the number of loads connected to the same signal output line 6 is largest.

More specifically, the case in which unit pixels 11 are disposed in N columns (N is an even number greater than or equal to 2) within the pixel array unit 10 of the solid-state image-capturing device 100 is considered. In this case, at a point between the AD conversion processing circuit 3 of an $(N/2)^{th}$ column and the AD conversion processing circuit 3 of an $(N/2+1)^{th}$ column disposed in correspondence with the columns of the pixel array unit 10, the signal output line 6 formed in the first substrate 50 and the signal output circuit 7 formed in the second substrate 60 are connected through the signal line connection unit 8. Thereby, even when viewed from the memory unit 5 of either the first column or the $N^{th}$ column having a largest number of loads, the number of memory units 5 of other columns from which no bit signal is output connected to the same signal output line 6 is reduced and a load to be driven when the memory unit 5 of the first column or the $N^{th}$ column outputs a bit signal becomes ½ that when the signal output circuit 7 is connected to one side of the signal output line 6 as in the conventional solid-state image-capturing device 900 illustrated in FIG. 5.

In addition, even when the number of memory units 5 provided within the AD conversion processing circuit 3 increases according to the number of bits of the digital signal output by the AD conversion unit 4 provided in the AD conversion processing circuit 3, it is possible to connect the signal output line 6 corresponding to each bit of the digital signal to each signal output circuit 7 via each corresponding signal line connection unit 8 within the inter-substrate connection unit 9. Thereby, when the signal output line 6 corresponding to a certain bit is connected to the signal output circuit 7, it is possible to connect the signal output circuit 7 at the intermediate point of the signal output line 6 without causing interference between the signal output lines 6, that is, without having to make a connection across the signal output line 6 corresponding to another bit.

As described above, in the solid-state image-capturing device 100 of this first embodiment, among the components of the solid-state image-capturing device 100, the signal output circuit 7 for externally outputting each bit signal output from any one AD conversion processing circuit 3 as a digital output signal output by the solid-state image-capturing device 100 is formed within the second substrate 60 separate from the first substrate 50 in which the AD conversion processing circuit 3 is formed. Thereby, in the solid-state image-capturing device 100 of this first embodiment, it is possible to further shorten a wire length of the signal output line 6 through which any one memory unit 5 corresponding to the same bit outputs the bit signal in all AD conversion processing circuits 3 disposed in correspondence with the columns of the pixel array unit 10 than in the conventional solid-state image-capturing device 900 and it is possible to reduce a load for driving the signal output line 6. Thereby, in the solid-state image-capturing device 100 of this first embodiment, it is possible to reduce a delay of signal transmission when a digital output signal of each bit is externally output and suppress the degradation of an operation speed of the solid-state image-capturing device 100.

In addition, in the solid-state image-capturing device 100 of this first embodiment, it is possible to lower driving capability of the memory units 5 provided in the AD conversion processing circuit 3 corresponding to each column of the pixel array unit 10 and reduce a circuit area or current consumption of the memory units 5 by forming the signal output circuit 7 within the second substrate 60 separate from the AD conversion processing circuit 3 as described above. Thereby, in the solid-state image-capturing device 100 of this first embodiment, it is possible to reduce a chip area of the first substrate 50 on which the pixel array unit 10 is disposed, that is, a mounting area of the solid-state image-capturing device 100, and implement size reduction or low current consumption of the solid-state image-capturing device 100 itself.

In this manner, even when a pixel pitch of the unit pixels 11 disposed within the pixel array unit 10 is further narrowed in association with the need for a high pixel density and the width of the AD conversion processing circuit 3 is further narrowed in the solid-state image-capturing device 100 of this first embodiment, it is possible to output a digital output signal obtained by AD-converting each pixel signal (analog signal) output from each unit pixel 11 within the pixel array unit 10 without degrading an operation speed.

Also, the case in which the AD conversion processing circuit 3 of each column and the signal output line 6 are formed in the first substrate 50 and the signal output circuit 7 is formed in the second substrate 60 as illustrated in FIGS. 1 and 2 in the solid-state image-capturing device 100 of this first embodiment has been described. However, none of the AD conversion processing circuit 3, the signal output line 6, and the signal output circuit 7 to be formed in either the first substrate 50 or the second substrate 60 is limited to the configurations illustrated in FIGS. 1 and 2, and, for example, each may be configured to be formed on an opposite substrate to the configurations illustrated in FIGS. 1 and 2. That is, the signal output circuit 7 can be configured to be formed in the first substrate 50 and the AD conversion processing circuit 3 of each column and the signal output line 6 can be configured to be formed in the second substrate 60. In this case, the pixel signal read line 2 for transferring the pixel signal (analog signal) output from the unit pixel 11 disposed in the pixel array unit 10 to the corresponding AD conversion processing circuit 3 is also connected to the AD conversion processing circuit 3 via the separate signal line connection unit 8.

Second Embodiment

Figure 3:
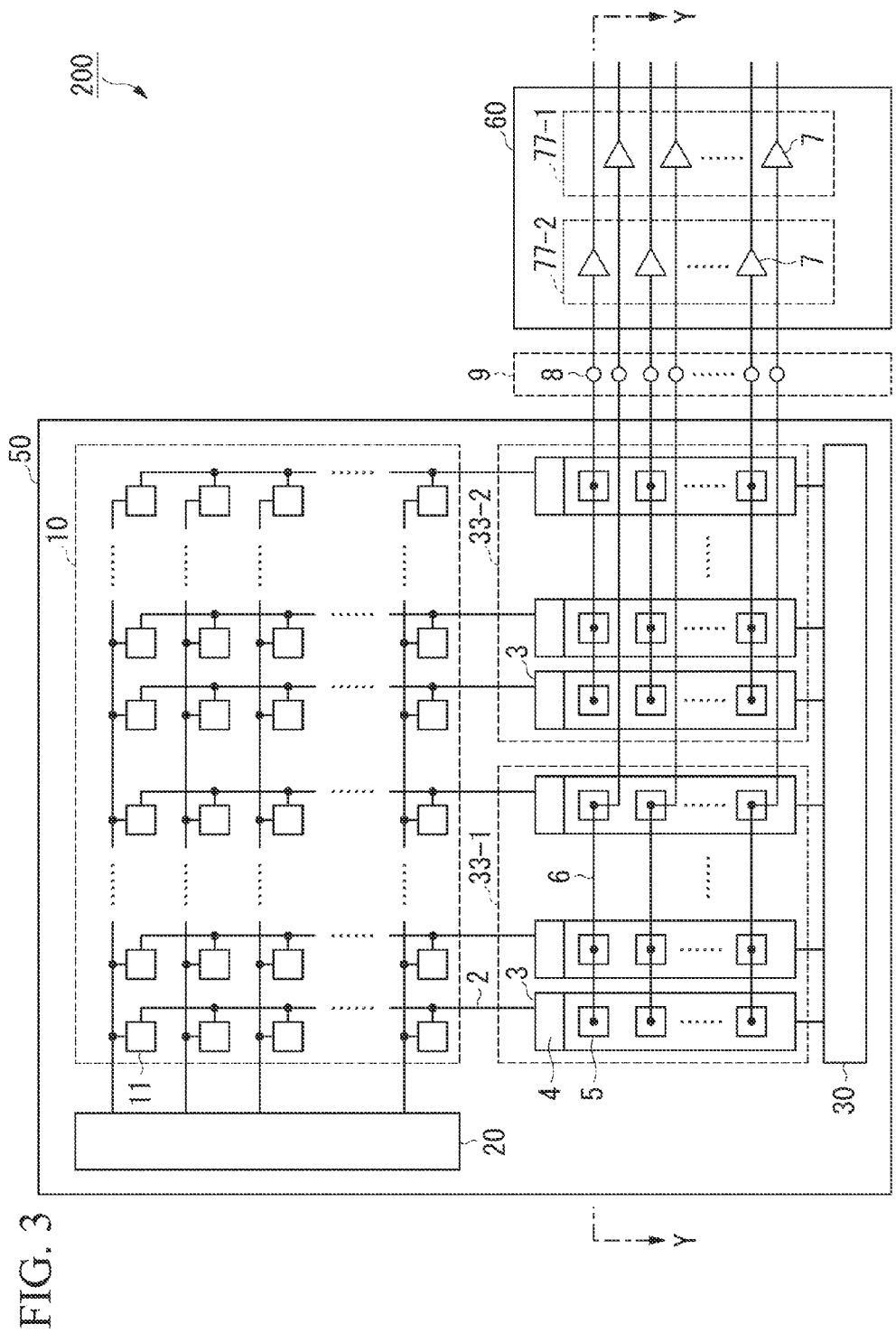
FIG. 3 is a block diagram illustrating a schematic configuration of a solid-state image-capturing device in a second embodiment of the present invention.

Next, the second embodiment of the image-capturing device of the present invention will be described. FIG. 3 is a block diagram illustrating a schematic configuration of a solid-state image-capturing device in this second embodiment. Like the solid-state image-capturing device 100 of the first embodiment illustrated in FIG. 1, the solid-state image-capturing device 200 of this second embodiment illustrated in FIG. 3 includes a first substrate 50, a second substrate 60, and an inter-substrate connection unit 9. Also, like the solid-state image-capturing device 100 of the first embodiment, the solid-state image-capturing device 200 includes a pixel array unit 10, a vertical scanning circuit 20, a plurality of pixel signal read lines 2, a plurality of AD conversion processing circuits 3, a horizontal scanning circuit 30, and a plurality of signal output lines 6 within the first substrate 50 and includes a plurality of signal output circuits 7 within the second substrate 60. The first substrate 50 and the second substrate 60 are separately manufactured and electrically connected by the inter-substrate connection unit 9 and form the solid-state image-capturing device 200 in a state in which the first substrate 50 and the second substrate 60 are bonded as in the solid-state image-capturing device 100 of the first embodiment.

The solid-state image-capturing device 200 is a column AD conversion type image sensor configured to sequentially output digital signals obtained by the AD conversion processing circuits 3, which provided as a functional circuit of the solid-state image-capturing device 200, AD-converting pixel signals (analog signals) output from unit pixels 11 within the pixel array unit 10 as digital output signals. The solid-state image-capturing device 200 divides the digital output signals into a plurality of channels and outputs the divided digital output signals. More specifically, the unit pixels 11 disposed within the pixel array unit 10 of the solid-state image-capturing device 200 are divided into a plurality of groups for every predetermined number of columns and the digital signals obtained by AD-converting the pixel signals (analog signals) output from the unit pixels 11 included in each division group are sequentially output as the digital output signals of the channels.

The solid-state image-capturing device 200 of this second embodiment is similar to the solid-state image-capturing device 100 of the first embodiment except for a configuration in which the digital output signals are divided into the plurality of channels and the divided digital output signals are output, and the components provided in the solid-state image-capturing device 200 are similar to components provided in the solid-state image-capturing device 100. Accordingly, in the block diagram of the solid-state image-capturing device 200 of this second embodiment illustrated in FIG. 3, the components similar to those of the solid-state image-capturing device 100 of the first embodiment are assigned the same reference numerals. Also, only a configuration and an operation in which the digital output signals are divided into the plurality of channels and the divided digital output signals are output will be described in the following description and detailed description of configurations and operations similar to those of the solid-state image-capturing device 100 will be omitted.

In the solid-state image-capturing device 200, a plurality of AD conversion processing circuits 3 disposed on the first substrate 50 are divided into a plurality of groups for every predetermined number of columns in correspondence with dividing unit pixels 11 disposed within the pixel array unit 10 into a plurality of groups. In addition, in the solid-state image-capturing device 200, the plurality of signal output circuits 7 disposed on the second substrate 60 are also divided according to each of groups in which the AD conversion processing circuits 3 are divided in association with dividing the plurality of AD conversion processing circuits 3 into a plurality of groups. Then, in the solid-state image-capturing device 200, components provided in groups are connected via the inter-substrate connection unit 9 between corresponding groups among groups of the AD conversion processing circuits 3 and groups of signal output circuits 7.

In this manner, in the solid-state image-capturing device 200, digital output signals are divided into a plurality of channels and the divided digital output signals are output by dividing the AD conversion processing circuits 3 and the signal output circuits 7 into a plurality of groups. Also, the number of groups into which the conversion processing circuits 3 are divided and the number of groups into which the signal output circuits 7 are divided are the number of channels into which the solid-state image-capturing device 200 divides the digital output signals to output the divided digital output signals.

The solid-state image-capturing device 200 illustrated in FIG. 3 is an example in which the unit pixels 11 disposed within the pixel array unit 10 are divided into two groups (a left group and a right group of the pixel array unit 10) of the left and right at an intermediate position of columns and digital output signals are output from channels corresponding to the left and right groups. That is, the solid-state image-capturing device 200 illustrated in FIG. 3 is an example of the solid-state image-capturing device which divides digital output signals into two channels and outputs the divided digital output signals.

In the solid-state image-capturing device 200, as illustrated in FIG. 3, the plurality of AD conversion processing circuits 3 are divided into two groups of an AD conversion processing circuit group 33-1 corresponding to the left group of the pixel array unit 10 and the AD conversion processing circuit group 33-2 corresponding to the right group of the pixel array unit 10. In addition, in the solid-state image-capturing device 200, as illustrated in FIG. 3, the plurality of signal output circuits 7 are divided into two groups of a signal output circuit group 77-1 corresponding to the AD conversion processing circuit group 33-1 and a signal output circuit group 77-2 corresponding to an AD conversion processing circuit group 33-2.

Then, in the solid-state image-capturing device 200, as illustrated in FIG. 3, the AD conversion processing circuit group 33-1 of the first substrate 50 and the signal output circuit group 77-1 of the second substrate 60 are connected via the inter-substrate connection unit 9 and the AD conversion processing circuit group 33-2 of the first substrate 50 and the signal output circuit group 77-2 of the second substrate 60 are connected via the inter-substrate connection unit 9.

More specifically, each signal output line 6 commonly connected to the memory units 5 corresponding to the same bit in all the AD conversion processing circuits 3 within the AD conversion processing circuit group 33-1 is connected to one signal output circuit 7 within the corresponding signal output circuit group 77-1 via the signal line connection unit 8 within the inter-substrate connection unit 9 corresponding to each signal output line 6. In addition, each signal output line 6 commonly connected to the memory units 5 corresponding to the same bit in all the AD conversion processing circuits 3 within the AD conversion processing circuit group 33-2 is connected to one signal output circuit 7 within the corresponding signal output circuit group 77-2 via the signal line connection unit 8 within the inter-substrate connection unit 9 corresponding to each signal output line 6.

Through this configuration, the solid-state image-capturing device 200 sequentially transfers digital signals according to pixel signals AD-converted within the first substrate 50 to the second substrate 60 for every column within each group to the second substrate 60 and sequentially outputs the digital signals as digital output signals, that is, digital output signals of channels, from the second substrate 60 to the outside of the solid-state image-capturing device 200.

Figure 4:
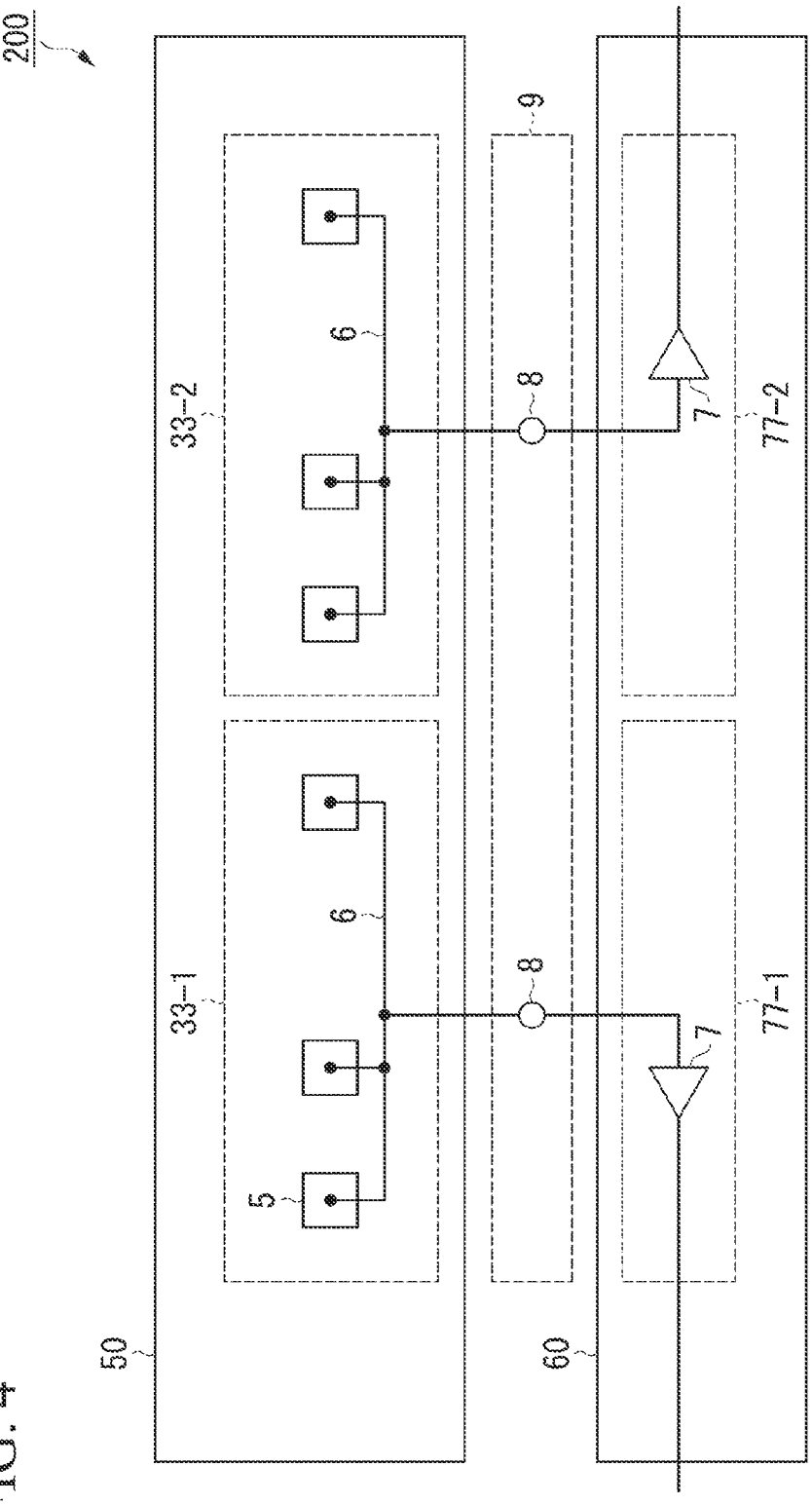
FIG. 4 is a block diagram illustrating a schematic configuration of substrates in the solid-state image-capturing device of this second embodiment.

Next, a configuration of the solid-state image-capturing device 200 of this second embodiment will be described. FIG. 4 is a block diagram illustrating a schematic configuration of substrates in the solid-state image-capturing device 200 of this second embodiment. FIG. 4 illustrates components formed on each substrate in a portion (Y-Y section) indicated by a dashed line Y-Y in a block diagram of the solid-state image-capturing device 200 illustrated in FIG. 3.

At a position of the Y-Y section in the solid-state image-capturing device 200, the memory unit 5 and the signal output line 6 corresponding to the same bit of the digital signal provided within the AD conversion processing circuit 3 of each column included in the AD conversion processing circuit group 33-1 and the memory unit 5 and the signal output line 6 corresponding to the same bit of the digital signal provided within the AD conversion processing circuit 3 of each column included in the AD conversion processing circuit group 33-2 are formed in the first substrate 50. In addition, in the second substrate 60, the signal output circuit 7 belonging to the signal output circuit group 77-1 and configured to output the bit signal output to the signal output line 6 included in the AD conversion processing circuit group 33-1 as the digital output signal to the outside of the solid-state image-capturing device 200 and the signal output circuit 7 belonging to the signal output circuit group 77-2 and configured to output the bit signal output to the signal output line 6 included in the AD conversion processing circuit group 33-2 as the digital output signal to the outside of the solid-state image-capturing device 200 are formed.

Then, in the solid-state image-capturing device 200, the signal output line 6 included in the AD conversion processing circuit group 33-1 formed in the first substrate 50 and the signal output circuit 7 included in the signal output circuit group 77-1 formed in the second substrate 60 are connected at one position of the signal output line 6 included in the AD conversion processing circuit group 33-1 through the signal line connection unit 8 within the inter-substrate connection unit 9. In addition, in the solid-state image-capturing device 200, the signal output line 6 included in the AD conversion processing circuit group 33-2 formed in the first substrate 50 and the signal output circuit 7 included in the signal output circuit group 77-2 formed in the second substrate 60 are connected at one position of the signal output line 6 included in the AD conversion processing circuit group 33-2 through the signal line connection unit 8 within the inter-substrate connection unit 9.

In FIG. 4, the case in which the signal output line 6 included in the AD conversion processing circuit group 33-1 formed in the first substrate 50 and the signal output circuit 7 included in the signal output circuit group 77-1 formed in the second substrate 60 are connected via the signal line connection unit 8 disposed at the intermediate point of the signal output line 6 included in the AD conversion processing circuit group 33-1 is illustrated. In addition, in FIG. 4, the case in which the signal output line 6 included in the AD conversion processing circuit group 33-2 formed in the first substrate 50 and the signal output circuit 7 included in the signal output circuit group 77-2 formed in the second substrate 60 are connected via the signal line connection unit 8 disposed at the intermediate point of the signal output line 6 included in the AD conversion processing circuit group 33-2 is illustrated. That is, the signal output line 6 formed in the first substrate 50 is connected to the signal output circuit 7 formed in the second substrate 60 at an intermediate position of a region in which all AD conversion processing circuits 3 included in each group are formed for each of the AD conversion processing circuit group 33-1 and the AD conversion processing circuit group 33-2.

In this manner, by connecting the signal output line 6 formed in the first substrate 50 and the signal output circuit 7 formed in the second substrate 60 at the intermediate point of the signal output line 6 included in the group for every division group, it is possible to shorten a wire length of the signal output line 6 from the memory unit 5 disposed on a farthest end within the group, that is, disposed at a farthest position (a position at a distance) from the intermediate point of each group, to the signal output circuit 7. Thereby, it is possible to reduce a load to be driven when the bit signal is output even in the memory unit 5 disposed on the farthest end within the group, that is, even in the memory unit 5 from which the wire length of the signal output line 6 within the group is longest and in which the number of loads connected to the same signal output line 6 is largest.

More specifically, the case in which unit pixels 11 are disposed in M columns (M is a multiple of 4 greater than or equal to 4) within the pixel array unit 10 of the solid-state image-capturing device 200 and the unit pixels 11 disposed within the pixel array unit 10 are divided into two groups at a point between an $(M/2)^{th}$ column and an $(M/2+1)^{th}$ column is considered. In this case, at a point between the AD conversion processing circuit 3 of an $(M/4)^{th}$ column and the AD conversion processing circuit 3 of an $(M/4+1)^{th}$ column disposed in correspondence with columns in a left group from the first column of the pixel array unit 10 to the $(M/2)^{th}$ column, the signal output line 6 and the corresponding signal output circuit 7 within the signal output circuit group 77-1 formed in the second substrate 60 are connected through the signal line connection unit 8. That is, at an intermediate point of the signal output line 6 to which the memory units 5 corresponding to the same bit are connected in the AD conversion processing circuit group 33-1, the signal output line 6 and the corresponding signal output circuit 7 within the signal output circuit group 77-1 are connected through the signal line connection unit 8.

In addition, at a point between the AD conversion processing circuit 3 of a $(3 \times M/4)^{th}$ column and the AD conversion processing circuit 3 of a $(3 \times M/4+1)^{th}$ column disposed in correspondence with columns in a right group from the $(M/2+1)^{th}$ column of the pixel array unit 10 to the $M^{th}$ column, the signal output line 6 and the corresponding signal output circuit 7 within the signal output circuit group 77-2 formed in the second substrate 60 are connected through the signal line connection unit 8. That is, at an intermediate point of the signal output line 6 to which the memory units 5 corresponding to the same bit are connected in the AD conversion processing circuit group 33-2, the signal output line 6 and the corresponding signal output circuit 7 within the signal output circuit group 77-2 are connected through the signal line connection unit 8.

In this manner, the unit pixels 11 disposed within the pixel array unit 10 are first divided into two groups in the solid-state image-capturing device 200 and therefore the number of AD conversion processing circuits 3 included in each of the AD conversion processing circuit group 33-1 and the AD conversion processing circuit group 33-2 becomes ½ that when the unit pixels 11 disposed within the pixel array unit 10 are not divided into groups, that is, when all the AD conversion processing circuits 3 are set as one group. That is, in the solid-state image-capturing device 200, the number of memory units 5 connected to the signal output line 6 of the same bit becomes ½ in each of the AD conversion processing circuit groups 33-1 and 33-2.

Then, in the solid-state image-capturing device 200, a load becomes ½ when the memory unit 5 having a largest number of loads drives each signal output line 6 by connecting to the corresponding signal output circuit 7 within the signal output circuit group 77-1 or 77-2 via the signal line connection unit 8 at an intermediate point of the same signal output line 6 in each of the AD conversion processing circuit groups 33-1 and 33-2.

Figure 5:
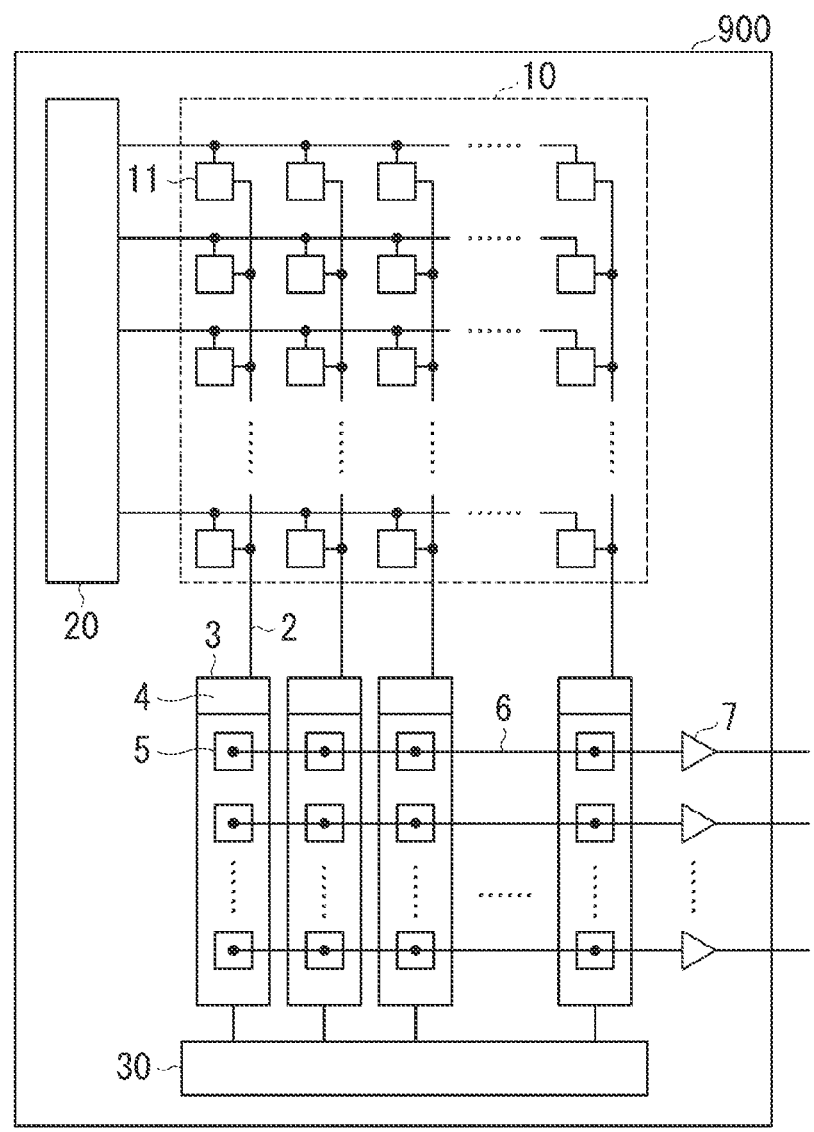
FIG. 5 is a block diagram illustrating a schematic configuration of a conventional solid-state image-capturing device.

Thereby, even when viewed from the memory units 5 of either the first column or the $(M/2)^{th}$ column having a largest number of loads within the AD conversion processing circuit group 33-1 or either the $(M/2+1)^{th}$ column or the $M^{th}$ column having a largest number of loads within the AD conversion processing circuit group 33-2, the number of memory units 5 of other columns from which no bit signal is output connected to the same signal output line 6 is reduced and a load to be driven when each memory unit 5 outputs the bit signal becomes ¼ that of the conventional solid-state image-capturing device 900 illustrated in FIG. 5.

In addition, as in the solid-state image-capturing device 100 of the first embodiment, it is possible to connect the signal output circuit 7 at the intermediate point of the signal output line 6 for every division group without interference between the signal output lines 6 even when the number of memory units 5 provided within the AD conversion processing circuit 3 has increased according to the number of bits of the digital signal output by the AD conversion unit 4 provided in the AD conversion processing circuit 3.

As described above, even in the solid-state image-capturing device 200 of this second embodiment, as in the solid-state image-capturing device 100 of the first embodiment, the signal output circuit 7 for externally outputting each bit signal output from any one AD conversion processing circuit 3 as a digital output signal to be output by the solid-state image-capturing device 200 among the components of the solid-state image-capturing device 200 is formed within the second substrate 60 separate from the first substrate 50 on which the AD conversion processing circuit 3 is formed. Thereby, even in the solid-state image-capturing device 200 of this second embodiment, it is possible to obtain similar effects to the solid-state image-capturing device 100 of the first embodiment.

In addition, in the solid-state image-capturing device 200 of this second embodiment, the unit pixels 11 disposed within the pixel array unit 10 are divided into a plurality of groups for every predetermined number of columns, the AD conversion processing circuits 3 are divided into the AD conversion processing circuit groups 33-1 and 33-2 corresponding to groups into which the unit pixels 11 are divided and the signal output circuits 7 are divided into the signal output circuit groups 77-1 and 77-2 corresponding to the groups into which the unit pixels 11 are divided. Thereby, in the solid-state image-capturing device 200 of this second embodiment, it is possible to further shorten a wire length of the signal output line 6 through which any one memory unit 5 corresponding to the same bit outputs the bit signals within groups (the AD conversion processing circuit groups 33-1 and 33-2) of the AD conversion processing circuits 3 corresponding to the groups into which the unit pixels 11 are divided and it is possible to reduce a load for driving the signal output line 6. Thereby, in the solid-state image-capturing device 200 of this second embodiment, it is possible to suppress the degradation of an operation speed of the solid-state image-capturing device 200 by reducing a delay of signal transmission when a digital output signal of each bit is externally output and increase the speed of the solid-state image-capturing device 200 by shortening a time required to output the digital output signal.

In addition, in the solid-state image-capturing device 200 of this second embodiment, it is possible to further lower the driving capability of the memory units 5 provided in each AD conversion processing circuit 3 and further reduce a circuit area or current consumption of the memory units 5 because it is possible to further reduce a load when the memory unit 5 drives each signal output line 6 as described above. Thereby, in the solid-state image-capturing device 200 of this second embodiment, it is possible to reduce a chip area of the first substrate 50 in which the pixel array unit 10 is disposed, that is, a mounting area of the solid-state image-capturing device 200, and implement size reduction or low current consumption of the solid-state image-capturing device 200 itself.

In this manner, even when a pixel pitch of the unit pixels 11 disposed within the pixel array unit 10 is further narrowed in association with the need for a high pixel density and the width of the AD conversion processing circuit 3 is further narrowed in the solid-state image-capturing device 200 of this second embodiment, it is possible to output a digital output signal obtained by AD-converting each pixel signal (analog signal) output from each unit pixel 11 within the pixel array unit 10 without degrading an operation speed.

Also, the case in which the AD conversion processing circuit 3 of each column and the signal output line 6 are formed in the first substrate 50 and the signal output circuit 7 is formed in the second substrate 60 in the solid-state image-capturing device 200 of this second embodiment, as illustrated in FIGS. 3 and 4, has been described. However, none of the AD conversion processing circuit 3, the signal output line 6, and the signal output circuit 7 to be formed in either the first substrate 50 or the second substrate 60 is limited to the configurations illustrated in FIGS. 3 and 4, and, for example, each may be configured to be formed on an opposite substrate to the configurations illustrated in FIGS. 3 and 4. That is, the signal output circuit 7 can be configured to be formed in the first substrate 50 and the AD conversion processing circuit 3 of each column and the signal output line 6 can be configured to be formed in the second substrate 60. In this case, the pixel signal read line 2 for transferring the pixel signal (analog signal) output from the unit pixel 11 disposed in the pixel array unit 10 to the corresponding AD conversion processing circuit 3 is also connected to the AD conversion processing circuit 3 via the separate signal line connection unit 8.

In addition, the case in which the unit pixels 11 disposed within the pixel array unit 10 are divided into two groups including a left group and a right group at an intermediate position of columns of the pixel array unit 10 as illustrated in FIGS. 3 and 4 as an example in which the unit pixels 11 are divided into a plurality of groups for every predetermined number of columns in the solid-state image-capturing device 200 of this second embodiment has been described. However, the configuration in which the unit pixels 11 disposed within the pixel array unit 10 are divided into a plurality of groups for every predetermined number of columns is not limited to the configurations illustrated in FIGS. 3 and 4. For example, the unit pixels 11 disposed within the pixel array unit 10 can be configured to be divided into two groups including a group of odd-numbered columns and a group of even-numbered columns.

In this case, it is only necessary to divide a plurality of AD conversion processing circuits 3 provided in the solid-state image-capturing device 200 into two groups including the AD conversion processing circuit group 33-1 corresponding to the group of odd-numbered columns of the pixel array unit 10 and the AD conversion processing circuit group 33-2 corresponding to the group of even-numbered columns of the pixel array unit 10 and divide a plurality of signal output circuits 7 provided in the solid-state image-capturing device 200 into two groups including the signal output circuit group 77-1 corresponding to the AD conversion processing circuit group 33-1 and the signal output circuit group 77-2 corresponding to the AD conversion processing circuit group 33-2. That is, it is only necessary to divide a plurality of signal output circuits 7 provided in the solid-state image-capturing device 200 into two groups including the signal output circuit group 77-1 corresponding to the group of odd-numbered columns of the pixel array unit 10 and the signal output circuit group 77-2 corresponding to the group of even-numbered columns. Also, even in this case, it is desirable to connect the signal output line 6 formed in the first substrate 50 to the signal output circuit 7 formed in the second substrate 60 through the signal line connection unit 8 within the inter-substrate connection unit 9 at an intermediate position of a region in which all AD conversion processing circuits 3 included in each group are formed for each of the AD conversion processing circuit group 33-1 and the AD conversion processing circuit group 33-2.

In addition, although the case in which the unit pixels 11 disposed within the pixel array unit 10 are divided into two groups in the solid-state image-capturing device 200 of this second embodiment has been described, the unit pixels 11 may be divided into more groups. It is possible to shorten a wire length of the signal output line 6 from the memory unit 5 disposed on the farthest end within each group to the signal output circuit 7 by dividing the unit pixels 11 disposed within the pixel array unit 10 into more groups, reduce the number of memory units 5 of other columns from which no bit signal is output connected to the same signal output line 6, and reduce a load to be driven when each memory unit 5 outputs a bit signal.

As described above, according to modes for carrying out the present invention, a solid-state image-capturing device which is an image-capturing device of the present invention has a configuration in which a plurality of substrates are connected and each signal output circuit for outputting an output signal from a functional circuit provided in the solid-state image-capturing device to the outside of the solid-state image-capturing device is formed within a substrate different from a substrate in which the functional circuit is formed. Thereby, when a plurality of functional circuits are provided in the solid-state image-capturing device according to the modes for carrying out the present invention, it is possible to shorten the wire length of the signal line commonly connected to a plurality of functional circuits affected by the number of functional circuits and reduce a load which impedes the driving of the signal line. Thereby, in the solid-state image-capturing device according to the modes for carrying out the present invention, it is possible to suppress the degradation of an operation speed due to a delay of signal transmission.

In addition, in the solid-state image-capturing device according to the modes for carrying out the present invention, it is possible to lower driving capability of a circuit for outputting a signal to a signal line and reduce a circuit area or current consumption of such a circuit by reducing the load which impedes the driving of the signal line. Thereby, it is possible to implement size reduction or lower power consumption of the solid-state image-capturing device itself according to the modes for carrying out the present invention.

Also, specific configurations of circuits in the present invention are not limited to the modes for carrying out the present invention and additions, omissions, substitutions, and other modifications can be made without departing from the spirit or scope of the present invention. For example, although the case in which a plurality of AD conversion processing circuits are provided as a functional circuit of the solid-state image-capturing device, pixel signals (analog signals) output from unit pixels within the pixel array unit are converted into digital signals, and the digital signals are sequentially output outside the solid-state image-capturing device has been described in this embodiment, it is similarly possible to apply an idea of the present invention even in the solid-state image-capturing device having a configuration in which each pixel signal (analog signal) output from each unit pixel is output without change. In this case, for example, when an amplifier circuit is connected to a pixel signal read line disposed in correspondence with each column of the pixel array unit and common to all unit pixels of the same column, a buffer circuit or the like for outputting a signal of a signal line commonly connected to buffer circuits of columns outside the solid-state image-capturing device is formed within a substrate different from a substrate in which each unit pixel within the pixel array unit is formed.

In addition, for example, even when the number of bits of the digital signal output by the AD conversion unit increases in order to increase the resolution of AD conversion of the AD conversion unit provided in the AD conversion processing circuit, it is similarly possible to apply an idea of the present invention.

In addition, although the case in which a plurality of AD conversion processing circuits are provided as a functional circuit of the solid-state image device has been described in this embodiment, the functional circuit provided in the solid-state image-capturing device is not limited to the modes for carrying out the present invention. For example, even in the solid-state image-capturing device of a configuration having a functional circuit of a correlated double sampling (CDS) process or the like for performing a process such as noise suppression for each pixel signal (analog signal) output from each unit pixel within the pixel array unit in place of the AD conversion processing circuit provided in the solid-state image-capturing device in this embodiment, it is similarly possible to apply an idea of the present invention.

In addition, even in the solid-state image-capturing device of a configuration having a plurality of types of functional circuits, for example, such as an AD conversion processing circuit and a CDS processing circuit, it is similarly possible to apply an idea of the present invention. Also, for example, as long as an output circuit within a functional circuit for outputting a final output signal of the solid-state image-capturing device according to output control from a horizontal scanning circuit and the signal output line are formed in the same substrate and the signal output circuit is formed in a separate substrate in the solid-state image-capturing device having a plurality of types of functional circuits, a substrate in which a component within each functional circuit is formed is not particularly limited.

In addition, although a column AD conversion type image sensor (solid-state image-capturing device) in which an AD conversion processing circuit is disposed in correspondence with each column of the pixel array unit has been described in this embodiment, a layout of the AD conversion processing circuit within the solid-state image-capturing device is not limited to the modes for carrying out the present invention. For example, one AD conversion processing circuit can be configured to be disposed for a plurality of columns of the pixel array unit.

In addition, although the case in which each unit pixel within the pixel array unit is formed in only the first substrate has been described in this embodiment, the pixel array unit formed in the solid-state image-capturing device is not limited to the modes for carrying out the present invention. For example, even in the solid-state image-capturing device in which the unit pixels within the pixel array unit are formed to be divided into the first and second substrates, it is similarly possible to apply an idea of the present invention.

In addition, although the case in which the AD conversion processing circuit which is a functional circuit provided in the solid-state image-capturing device is formed in only the first substrate has been described in this embodiment, the functional circuit to be formed in the solid-state image-capturing device is not limited to the modes for carrying out the present invention. For example, if the output circuit within the functional circuit for outputting the final output signal of the functional circuit and the signal output line are formed on the same substrate and the signal output circuit is formed on a separate substrate, it is possible to obtain similar effects even in the solid-state image-capturing device in which the components within the functional circuits are formed to be divided into the first and second substrates. That is, if the memory unit 5 and the signal output line 6 are formed on one substrate of the first substrate 50 and the second substrate 60 as the same substrate and the signal output circuit 7 is formed on the other substrate of the first substrate 50 and the second substrate 60 in this embodiment, it is possible to obtain similar effects even when the AD conversion unit 4 is formed within a substrate separate from a substrate on which the memory unit 5 and the signal output line 6 are formed.

In addition, in the solid-state image-capturing device according to the embodiment of the present invention, two substrates may be connected through the connection unit or three or more substrates may be connected through the connection unit. In the case of the solid-state image-capturing device in which the three or more substrates are connected through the connection unit, two substrates thereof correspond to the first and second substrates according to the claims.

While embodiments of the present invention have been described with reference to the drawings, specific configurations are not limited to the embodiments. Various modifications are also included without departing from the spirit or scope of the present invention.

The present invention is widely applicable to image-capturing devices and it is possible to reduce a load of a signal line commonly connected to a plurality of functional circuits in the image-capturing devices and suppress the degradation of an operation speed due to a delay of signal transmission.

What is claimed is:

1. An image-capturing device including a solid-state image-capturing device in which a first substrate and a second substrate are electrically connected through connection units, the image-capturing device comprising:
   a pixel unit in which a plurality of pixels, each of which has a photoelectric conversion element for generating a photoelectric conversion signal according to an intensity of incident light disposed on the first substrate, are disposed in a two-dimensional matrix and configured to output a photoelectric conversion signal generated by each of the pixels as a pixel signal for every row;
   a plurality of signal processing units, each of which is disposed for every one or more columns of the plurality of pixels provided in the pixel unit, performs predetermined signal processing on the pixel signal output from the pixel of a corresponding column, and outputs a processed signal including a plurality of signals after the signal processing is performed;
   a plurality of signal output lines configured to transfer each signal of the processed signal output by the signal processing unit corresponding to the pixel of the column from which an output operation is performed within a plurality of processed signals output by the plurality of signal processing units; and
   a plurality of signal output units configured to perform the output operation after compensating for the strength of each signal of the processed signal transferred through each of the plurality of signal output lines,
   wherein at least each of components for outputting each signal of the processed signal provided in each of the signal processing units to the corresponding signal output line and each of the signal output lines are disposed on either of the first substrate and the second substrate,
   the signal output unit is disposed on either of the first substrate and the second substrate in which each of the components provided in the signal processing unit and each of the signal output lines are not disposed,
   the signal output line and the signal output unit are connected through one corresponding connection unit, and
   each of the connection units is disposed at a position at which a distance from the signal processing unit corresponding to the column of the pixel disposed on a farthest end in the pixel unit to the connection unit is shorter than a distance between two signal processing units corresponding to the columns of the pixels disposed on two ends of the pixel unit.

2. The image-capturing device according to claim 1, wherein the plurality of pixels disposed in the pixel unit are divided into a plurality of groups for every predetermined number of columns of the pixel unit, the plurality of signal processing units are divided into a plurality of signal processing unit groups corresponding to the groups of the pixel unit, the plurality of signal output lines correspond to the signal processing unit groups and transfer each signal of the processed signal output by the signal processing unit corresponding to the pixel of the column from which the output operation is performed within the plurality of processed signals output by the plurality of signal processing units included in the signal processing unit group for every corresponding signal processing unit group, the plurality of signal output units are divided into a plurality of signal output unit groups corresponding to the plurality of signal processing unit groups, the connection unit corresponds to each of the plurality of signal output lines, at least each of the components provided in each of the signal processing units included in the signal processing unit group to the corresponding signal output line and each of the signal output lines corresponding to each of the signal processing unit groups are disposed on either of the first substrate and the second substrate, each of the signal output units included in the signal output unit group is disposed on either of the first substrate and the second substrate in which each of the components and each of the signal output lines are not disposed, the signal output line of each signal processing unit group and the signal output unit included in the signal output unit group corresponding to the signal output line are connected through one corresponding connection unit, and each of the connection units is disposed at a position at which a distance from the signal processing unit corresponding to the column of the pixel disposed at the farthest end in the pixel unit within the group of the pixel unit corresponding to the signal processing unit group to the connection unit is shorter than a distance between two signal processing units corresponding to the columns of the pixels corresponding to two ends of the pixel unit within the group of the pixel unit for every signal processing unit group.

3. The image-capturing device according to claim 2, wherein the signal processing unit is an AD conversion processing circuit configured to output an n (n is a natural number greater than or equal to 1)-bit digital signal obtained by AD-converting the pixel signal as the processed signal, the plurality of signal output units are n buffer amplifier circuits corresponding to bit signals of the digital signal, and the plurality of signal output lines are n signal output lines corresponding to the bit signals of the digital signal.

4. The image-capturing device according to claim 3, wherein each of the connection units is disposed at an intermediate position between two signal processing units corresponding to columns of pixels having a largest distance within the pixel unit corresponding to each signal processing unit for outputting the processed signal to a corresponding signal output line.

5. The image-capturing device according to claim 2, wherein each of the connection units is disposed at an intermediate position between two signal processing units corresponding to columns of pixels having a largest distance within the pixel unit corresponding to each signal processing unit for outputting the processed signal to a corresponding signal output line.

6. The image-capturing device according to claim 1, wherein the signal processing unit is an analog-to-digital (AD) conversion processing circuit configured to output an n (n is a natural number greater than or equal to 1)-bit digital signal obtained by AD-converting the pixel signal as the processed signal, the plurality of signal output units are n buffer amplifier circuits corresponding to bit signals of the digital signal, and the plurality of signal output lines are n signal output lines corresponding to the bit signals of the digital signal.

7. The image-capturing device according to claim 3, wherein each of the connection units is disposed at an intermediate position between two signal processing units corresponding to columns of pixels having a largest distance within the pixel unit corresponding to each signal processing unit for outputting the processed signal to a corresponding signal output line.

8. The image-capturing device according to claim 1, wherein each of the connection units is disposed at an intermediate position between two signal processing units corresponding to columns of pixels having a largest distance within the pixel unit corresponding to each signal processing unit for outputting the processed signal to a corresponding signal output line.

* * * * *